United States Patent [19]

Gruen

[11] Patent Number: 5,370,855
[45] Date of Patent: *Dec. 6, 1994

[54] CONVERSION OF FULLERENES TO DIAMOND

[76] Inventor: Dieter M. Gruen, 1324 59th St., Downers Grove, Ill. 60515

[ * ] Notice: The portion of the term of this patent subsequent to May 11, 2010 has been disclaimed.

[21] Appl. No.: 35,419

[22] Filed: Mar. 23, 1993

Related U.S. Application Data

[63] Continuation-in-part of Ser. No. 797,590, Nov. 25, 1991, Pat. No. 5,209,916.

[51] Int. Cl.$^5$ .............................................. C01B 31/06
[52] U.S. Cl. ................. 423/446; 204/157.47; 427/460; 117/929; 423/DIG. 39
[58] Field of Search .................. 427/37, 38, 249, 523; 423/446, 460, DIG. 39; 156/DIG. 68; 204/157.15, 157.4, 157.44, 157.47

[56] References Cited

U.S. PATENT DOCUMENTS

| | | | |
|---|---|---|---|
| 4,559,901 | 12/1985 | Morimoto et al. | 427/523 |
| 4,629,631 | 12/1986 | Dearnaley . | |
| 4,634,600 | 1/1987 | Shimizu et al. | 427/523 |
| 5,132,105 | 7/1992 | Remo | 423/446 |
| 5,209,916 | 5/1993 | Gruen | 423/446 |

OTHER PUBLICATIONS

Parker, D. H. et al, "High Yield Synthesis, Separation and Mass Spectrometric Characterization of Fullerenes $C_{60}$ to $C_{266}$", J. Am. Chem. Sco. 113, 7499–7503 (1991).
Wurz, P. and Lykke, R.; "Delayed Electron Emission from Photoexcited $C_{60}$"; J. Chem Phys. 95, 7008–7010 (1991).
Lykke, K. R. et al., "Spectrometric Characterization of Purified $C_{60}$ and $C_{70}$"; Mats. Res. Soc. Symposium Proc. Vo. 206, 679 (1991).
Wasielewski, M. R., et al. "Triplet States of Fullerenes $C_{60}$ and $C_{70}$; Electron Paramagnetic Resonance Spectra, Photophysics and Electronic Structures"; J. Am. Chem. Soc. 113, 2774–2776 (1991).
Beck, Ranier D. et al, "Resilience of All-Carbon Molecules $C_{60}$ and $C_{84}$: A Surface-Scattering Time-of-Flight Investigation"; J. Chem. Phys. 1991, 95, 8402–8409.
Van, Jon; "Exotic Form Opens New Carbon Uses"; Chicago Tribune, Sunday Nov. 3, 1991.
Angus, John C. et al; "Metastable Growth of Diamond and Diamond–Like Phases"; Annul. Rev. Mater. Sci. 1991. 21:221–48.
Curl, Robert F. et al; "Fullerenes"; Sci Amer. Oct. 1991, 54–63.
Meijer, Gerard et al; "Laser Deposition of Carbon Clusters on Surfaces: A New Approach to the Study of Fullerenes"; J. Chem. Phys. 93(11), Dec. 1990.
Edelson, Edward; "Buckyball The Magic Molecule"; Popular Science, Aug. 1991, 52–57; 87.
Kroto, H. W. et al; "$C_{60}$: Buck Minster Fullerene"; Chem. Rev. 1991, 91, 1213–1235.
Kratschmer, W. et al.; "Solid $C_{60}$: A New Form of Carbon", Nature, vol. 347, 27 Sep. 1990, pp. 354–358.
"Superconductivity at 28.6 K in a Rubidium–$C_{60}$ Fullerene Compound, $Rb_xC_{60}$, Synthesized by a Solution–Phase Technique"; Amer. Chem. Soc. 0020-1669/91/1330-2962.
Frenklach, Michael et al; "Growth Mechanism of Vapor–Deposited Diamond"; J. Mater. Res. 3(1) Jan.-/Feb. 1988, 133–139.
"Laser Deposition of Carbon Clusters on Surfaces: New Approach to the Study of Fullerenes", Meijer, G. et al. J. Chem. Phys. 93, 7800 (1990).

*Primary Examiner*—Michael Lewis
*Assistant Examiner*—Stephen G. Kalinchak
*Attorney, Agent, or Firm*—Reinhart, Boerner, Van Deuren, Norris & Rieselbach

[57] ABSTRACT

A method of forming synthetic hydrogen defect free diamond or diamond like films on a substrate. The method involves providing vapor containing fullerene molecules with or without an inert gas, providing a device to impart energy to the fullerene molecules, fragmenting at least in part some of the fullerene molecules in the vapor or energizing the molecules to incipient fragmentation, ionizing the fullerene molecules, impinging ionized fullerene molecules on the substrate to assist in causing fullerene fragmentation to obtain a thickness of diamond on the substrate.

24 Claims, No Drawings

CONVERSION OF FULLERENES TO DIAMOND

This is a continuation in part of application Ser. No. 07/797,590, filed Nov. 25, 1991, now U.S. Pat. No. 5,209,926.

BACKGROUND OF THE INVENTION

The present invention relates generally to methods for the conversion of fullerenes to diamond or diamond-like films. More particularly, the invention is concerned with the manufacture of nonhydrogenic fullerenes as precursors for the synthesis of diamond or diamond-like films. Because of their thermodynamic instability with respect to diamond, the conversion of fullerenes to diamond has significant advantages over presently used methods for producing synthetic diamonds.

The prior an methods of manufacturing diamond can be divided into two main approaches. In the first or high-pressure method, graphite powder is heated to about 500° C. under 60kbar of pressure in the presence of an iron catalyst. Under this extreme, but equilibrium, condition of pressure and temperature, graphite can be convened to diamond. About 75 tons of diamond are produced industrially each year in this way. The second or low pressure method of producing diamond artificially involves producing a mixture usually of a few percent of methane in hydrogen gas. A hot filament or a microwave discharge is used to dissociate the methane molecule to for the methyl radical, $CH_3$, and the hydrogen molecule is dissociated to for hydrogen atoms. Diamond or diamond-like films can be grown this way epitaxially on diamond nuclei. Such films, however, always contain small contaminating amounts (0.1–1%) of hydrogen which are undesirable for many applications.

The usefulness and novelty of fullerene precursors for diamond synthesis stem from several of their properties: fullerene precursors are thermodynamically unstable with respect to diamond and, therefore, stable only in a kinetic sense. In addition, since the fullerenes are molecular entities, they are volatile with $C_{60}$ having a vapor pressure of $10^{-4}$ Torr at 500° C. Fullerenes are also allotropes of carbon; that is, they contain no hydrogen; and therefore, diamonds produced from fullerene precursors are hydrogen-defect free. Another useful characteristic of fullerene is the chemical bond in $C_{60}$ is intermediate between grapite ($sp^2$) and diamond ($sp^3$). Furthermore, fragmentation involving carbon-carbon bond breakage occurs via the elimination of $C_2$ groups. Recent scanning tunneling microscope studies have shown $C_2$ groups to be intimately involved in the growth of epitaxial diamond films, particularly of the "dimer rows" of the 2×1 reconstructed <100> surface. It has also been determined both the positive $C_{60}^+$ and negative $C_{60}^-$ ions are stable entities that can be accelerated to kilovolt energies under an applied electrostatic potential. The so-called LUMO (lowest unoccupied molecular orbital) of the fullerenes also is an antibonding three-fold degenerate orbital that can accept up to six electrons from electron donors such as the alkali metals. The resultant repulsion between delocalized electrons weakens the carbon-carbon bonds of the $C_{60}$ cage and provides a mechanism for the fullerene to undergo diamond transformation.

In particular, fragmentation of fullerenes involving carbon-carbon bond breakage can be achieved by energizing the fullerene molecule in a variety of ways including acceleration of the ionized molecule with subsequent bombardment of a surface resulting in diamond-like film growth. The variety of methods for energizing fullerene molecules with the objective of fragmentation of incipient fragmentation includes, but is not limited to, any conventional means of inducing molecular fragmentation such as by absorption of photons; fragmentation by passage over a hot filament; fragmentation in a radio frequency or RF-plasma; fragmentation in a DC plasma jet; and fragmentation in a microwave plasma.

In all of these cases, fragmentation of fullerenes (as for fragmentation of any molecule) occurs in part as a result of absorption of internal energy in the form of rotational, vibrational, and electronic energy. The rate of fragmentation depends on the degree of energy absorption and can become appreciable when the fullerene molecules become highly energized, corresponding to the absorption of 40–50 eV of internal energy which in turn corresponds to a thermal "temperature" of 3000–4000° K. A fullerene molecular ion, which has acquired a high state of internal energy, consequently needs only a small acceleration potential (10–100 V) to induce fragmentation on collision with a surface. Such an acceleration potential can be supplied either by the plasma potential itself or by DC or RF biasing of the substrate on which diamond or diamond-like film growth takes place.

The mechanisms by means of which the fullerene molecules acquire their high internal energies, which are a prerequisite to molecular fragmentation in the absence of a large ($\sim 1$ keV) external acceleration potential, are, for example, the conventional molecular fragmentation method of (1) photon absorption in the case of photon irradiation leading to photofragmentation, (2) thermal energy absorption in the case of passage of fullerene molecules over a hot filament, (3) electron and ion collisions in the case of RE, DC, or microwave plasmas. It is well known to anyone versed in the art that imparting sufficient energy to hydrocarbon molecules such as methane, acetylene, benzene, etc. and to other species such as graphite results in fragmentation, that is to say, carbon-carbon and carbon-hydrogen bond breaking. Such fragmentation, leading to the production of methyl radicals, $CH_3$ is a key step for diamond film formation from methane, for example. A variety of methods for imparting sufficient energy to hydrocarbon molecules so as to fragment them with subsequent formation of diamond films has been devised and successfully used in a now conventional manner. Among these methods are a hot filament, an RF plasma discharge device, a DC-thermoplasma device, a DC-plasma jet device, a high intensity photon source and a microwave plasma.

In the case of fullerenes, energy supplied by heat, photons, electrons, or collisions with gas molecules likewise results in fragmentation with the production of $C_2$ fragments. The devices to supply fragmentation energy referred to above are well known to impart energy to molecules.

All of the methods for imparting internal energy to fullerene molecules also lead to varying degrees of ionization as a result of photon absorption as well as electron and ion collisions. Electron emission from $C_{60}$ results in $C_{60}^+$ while electron attachment gives $C_{60}^-$. Depending on the magnitude of energy absorbed by the fullerene molecules, fragmentation occurs either in the gas phase or, with the help of a small (10–100 eV) bias potential, on collision with a substrate.

OBJECTS OF THE INVENTION

It is therefore an object of the invention to provide a novel method to energize fullerene molecules by passage over a hot filament causing fragmentation or incipient fragmentation and ionization by electron attachment or electron emission with subsequent impingement on a biased substrate and resultant diamond or diamond-like growth on diamond or fullerene nuclei.

It is another object of the invention to provide an improved method to energize fullerene molecules in a radio frequency plasma discharge, causing fragmentation or incipient fragmentation and ionization by electron attachment or electron emission with subsequent impingement on a biased substrate and resultant diamond or diamond-like growth on diamond or fullerene nuclei.

It is a further object of the invention to provide a novel method to energize fullerene molecules in a DC thermoplasma causing fragmentation or incipient fragmentation and ionization by electron attachment or electron emission with subsequent impingement on a biased substrate and resultant diamond or diamond-like growth on diamond or fullerene nuclei.

It is an additional object of the invention to provide an improved method to energize fullerene molecules in a DC plasma jet causing fragmentation or incipient fragmentation and ionization by electron attachment or electron emission with subsequent impingement on a biased substrate and resultant diamond or diamond-like growth on diamond or fullerene nuclei.

It is also an object of the invention to provide a novel method to energize fullerene molecules with an intense flux of photons as from a laser causing fragmentation or incipient fragmentation and ionization by electron attachment or electron emission with subsequent impingement on a biased substrate and resultant diamond or diamond-like growth on diamond or fullerene nuclei.

It is again an object of the invention to provide an improved method to energize fullerene molecule using a microwave plasma discharge causing fragmentation or incipient fragmentation and ionization by electron attachment or electron emission with subsequent impingement on a biased substrate and resultant diamond or diamond-like growth on diamond or fullerene nuclei.

Other objects, features and advantages of the present invention will be readily apparent from the following description of the preferred embodiments thereof.

DESCRIPTION OF PREFERRED EMBODIMENTS

Diamond can be formed using compounds of the alkali metals with $C_{60}$ (e.g., $K_3C_{60}$, $K_4C_{60}$, $K_6C_{60}$). These carbon-alkali metals are mixed with conventional diamond powder and placed in a molybdenum or tantalum container that is sealed by electron beam welding in an inert atmosphere. The capsule is placed in a tetrahedral anvil apparatus and subject to pressures of 5–20 kbar and temperatures of 500°–1000° C. These conditions are maintained for 1–10 hours after which the pressure and temperature are lowered to ambient conditions. The container is then removed, and the mixture of diamond, unreacted $C_{60}$ and excess potassium placed in a vessel. Heating the vessel to 500° C. in a vacuum sublimes out the $C_{60}$ and potassium, leaving diamond behind. A commercially more economical procedure is to substitute a mixture of $C_{60}$ and $C_{70}$ for pure $C_{60}$, the same results can be achieved.

In another form of the invention, compounds of the alkali metals with $C_{60}$ (e.g., $K_3C_{60}$, $K_4C_{60}$, $K_6C_{60}$) are combined in a suitable refractory vessel, or container, such as Ta or Mo, with a diamond seed crystal. The seed crystal is disposed on a heater button or platform with power supplied by a separate power supply. The vessel is then placed in a furnace and heated in the furnace to a temperature of 500°–700° C. The diamond seed crystal is heated by the separate power supply to 1000°–1200° C. In the vapor phase, charge transfer from the alkali metal atoms to $C_{60}$ produces $C_{60}^-$ which converts to diamond epitaxially on the seed crystal. Growth is continued until the diamond crystal has reached the desired size.

In a further form of the invention positive or negative ions of $C_{60}$, $C_{70}$ or higher fullerenes or mixtures of fullerenes are produced in a conventional ion source. Well-known methods for producing the ions can be used: laser ablation, electron attachment, electron bombardment or photoionization. A means is provided for electrostatically accelerating the ions to kilovolt energies. A variety of commercially available ion sources including ion implanters, can be used for this purpose. Because there is only one positive charge per $C_{60}$ or $C_{70}$ molecule, space charge limitations are overcome; and fullerene ion currents can be obtained which are about two orders of magnitude larger than equivalent carbon ion currents using graphite as the source of carbon. Bombardment of surfaces covered with diamond nuclei or fullerene coatings with fullerene ions having energies of at least about 250eV (threshold cumulative energy needed to cause fragmentation of fullerene) results in the formation of diamond or diamond-like films. As explained hereinbefore, the fullerene molecule can acquire energy by imparting energy to the molecule in various ways. That is, one can impart energy in one or more increments such as by laser bombardment to provide part of the necessary minimum internal energy (about 250eV) and then accelerating the ionized form of the molecule to impact on a substrate causing transfer of the kinetic energy to internal energy resulting in fragmentation. Examples of various means to impart energy include, for example, (1) photon absorption using a photon source, such as a laser, (2) thermal energy absorption using a hot filament and (3) electron and ion collisions in the case of RF, DC or microwave plasmas. Any of these and other conventional means of imparting energy can act in concert with fullerene ion acceleration to cause fragmentation upon impact on a substrate, thereby enabling formation of synthetic diamond or diamond-like films on the substrate. Bombardment of surfaces, and particularly refractory metal surfaces, such as tungsten, with fullerene ions having energies from about 2.5keV to at least about 250MeV results in implantation of carbon and the formation of surface or subsurface carbides. The following nonlimiting examples illustrate other features of the invention.

EXAMPLE I

Fullerenes with formulas $C_{60}$ to $C_{266}$ were prepared in a plasma arc discharge between graphite electrodes. Almost one-third of the material extractable with toluene and higher boiling point organic solvents is composed of $C_{84}$ to $C_{200}$. The fullerene compositions were characterized by conventional mass spectrometric measurements.

EXAMPLE II

A 50 mg charge of $C_{60}$ was placed in a quartz tube and heated to 450° C. A stream of He gas was flowed through the tube for 3 hours at a pressure of 10 Torr. The $C_{60}$ vapor was transported by the flowing He gas to a region of the quartz tube in which a discharge at 2.45 GHz was maintained at a power level of 200 watts. At the end of the run, the walls of the reactor vessel immediately beyond the discharge were covered with a film that was milky in appearance and quite transparent to room light. There has been a conversion from black $C_{60}$ to a transparent material.

EXAMPLE III

Potassium-$C_{60}$ compounds were synthesized using plasma arc discharge produced soot which was processed by solvent extraction and exchange column liquid chromatography to produce pure $C_{60}$. The preparation was carried out with a conventional Schlenk apparatus. Small potassium (K) chips were added to a solution of $C_{60}$ in toluene and reacted for two hours. The black precipitate that formed was filtered off, placed on a stainless steel sample mount, and inserted into a laser desorption time-of-flight mass spectrometer. No $C_{60}^+$ was seen which is in contrast to the positive ion spectrum from the original $C_{60}$ sample. Thus, $K_xC_{60}$ has formed an ion-like bonding with the $C_{60}$ forming the anion and the K, the cation.

EXAMPLE IV

The above mentioned conventional ion producing and ion accelerating mass spectrometer has also been used to characterize the photoionization and photofragmentation of $C_{60}$ and $C_{70}$. Photoionization performed without fragmentation to produce $C_{60}^+$ from neutral $C_{60}$ molecules was accomplished by using laser beam photons of 105eV, approximately 3eV above the ionization potential of $C_{60}$. The photoions were accelerated to several keV and detected by a channel-plate detector. By increasing laser powers to higher intensities, various photofragments were produced. These photofragments included $C_{58}$, $C_{56}$ ... $C_{32}$ ... $C_{10}$, $C_8$, ... C. Thus, the higher the laser power, the lower the nuclearity of the carbon cluster that is produced.

While preferred embodiments and limited examples have been described, it will be clear to those of skill in the art that various changes and modifications can be made without departing from the claimed invention in its broader aspects as set forth in the claims provided hereinafter.

What is claimed is:

1. A method of forming synthetic hydrogen defect free diamond or diamond like films on a substrate having a substrate surface covered with a coating selected from the group consisting of fullerene and diamond, comprising the steps of:
   (a) providing a vapor selected from the group consisting of fullerene molecules and an inert gas and fullerene molecules, said fullerene molecules consisting of carbon-carbon bonds;
   (b) providing means for imparting energy to said fullerene molecules consisting of carbon-carbon bonds;
   (c) exposing said vapor of fullerene molecules consisting of carbon-carbon bonds to said means for imparting energy;
   (d) transferring energy from said means for imparting energy to said vapor of fullerene molecules consisting of carbon-carbon bonds;
   (e) ionizing said fullerene molecules consisting of carbon-carbon bonds having received energy from said means for imparting energy;
   (f) impinging said ionized fullerene molecules consisting of carbon-carbon bonds on said substrate and in combination with said step (d) causing fragmentation of said fullerene molecules consisting of carbon-carbon bonds; and
   (g) continuing said steps (a)–(f) to obtain a thickness for said hydrogen defect free diamond or diamond-like film on said substrate surface.

2. The method as defined in claim 1 wherein said means for imparting energy is selected from the group consisting of a hot filament, an RF plasma discharge device a DC plasma jet device, a photon source and a microwave discharge device.

3. The method as defined in claim 1 wherein said step of ionizing comprises performing electron attachment on said fullerene molecules.

4. The method as defined in claim 1 wherein said step of ionizing comprises carrying out electron emission on said fullerene molecules.

5. The method as defined in claim 1 further including the step of applying a bias voltage to said substrate wherein said bias voltage comprises about 10–100 volts.

6. The method as defined in claim 1 wherein said step of transferring energy causes incipient or actual fragmentation of said fullerene molecules.

7. The method as defined in claim 6 wherein said incipient or actual fragmentation involves absorption of at least about 40–50 eV of internal energy per molecule.

8. The method as defined in claim 7 wherein said step of impinging said ionized fullerene molecules on said substrate involves accelerating said ionized fullerene molecules to about 10–100 volts energy to cause fragmentation.

9. The method as defined in claim 1 wherein said vapor of fullerene molecules comprise $C_{60}$ molecules.

10. The method as defined in claim 1 wherein said coating of fullerene comprises a fullerene prepared by heating fullerene containing soot.

11. The method as defined in claim 1 wherein said step of transferring energy plus said step of impinging said fullerene molecules on said substrate provides at least 250eV internal energy to said fullerene molecule.

12. A method of forming synthetic hydrogen free diamond or diamond-like film on a substrate having a substrate surface covered with a coating selected from the group consisting of fullerene and diamond, comprising the steps of:
   (a) providing a vapor containing fullerene molecules consisting of carbon-carbon bonds;
   (b) providing means for imparting energy to said fullerene molecules consisting of carbon-carbon bonds, said means selected from the group consisting of a hot filament, an RF plasma discharge device, a photon source and a microwave discharge device;
   (c) imparting energy to said fullerene molecules consisting of carbon-carbon bonds using said means for imparting energy and also ionizing said fullerene molecules consisting of carbon-carbon bonds;
   (d) accelerating said ionized fullerene molecules to impact on said substrate assisting in causing fragmentation of said fullerene molecules consisting of carbon-carbon bonds; and (e) continuing said steps (a)–(e) to obtain a thickness for said hydrogen free diamond or diamond-like film on said substrate.

13. The method as defined in claim 12 wherein said fullerene molecules comprise $C_{60}$ molecules.

14. The method as defined in claim 12 further including the step of applying a bias voltage to said substrate.

15. The method as defined in claim 14 wherein said bias voltage comprises at least about 10 volts.

16. The method as defined in claim 14 wherein said step of imparting energy to said fullerene molecules comprises transferring about 40–50eV energy to said fullerene molecules.

17. The method as defined in claim 14 wherein said step of biasing comprises at least one of (a) applying said bias voltage by at least one of RF and DC biasing of said substrate and establishing a plasma potential about said substrate.

18. The method as defined in claim 12 wherein said step of accelerating comprises accelerating said ionized fullerene molecules to at least about 10eV.

19. The method as defined in claim 12 wherein said coating of fullerene comprises a fullerene prepared by heating fullerene containing soot.

20. The method as defined in claim 12 wherein said steps (c) and (d) result in providing at least 250eV internal energy to said fullerene molecules.

21. A method of forming synthetic hydrogen free diamond or diamond-like films on a substrate having a substrate surface covered with a coating selected from the group consisting of fullerene and diamond, comprising the steps of:

(a) providing a vapor containing fullerene molecules consisting of carbon-carbon bonds;

(b) providing means for imparting energy to said fullerene molecules consisting of carbon-carbon bonds;

(c) imparting energy to said fullerene molecules consisting of carbon-carbon bonds using said means for imparting energy to cause at least one of incipient fragmentation and actual fragmentation of said fullerene molecules consisting of carbon-carbon bonds;

(d) ionizing said fullerene molecules consisting of carbon-carbon bonds;

(e) impinging said ionized fullerene molecules consisting of carbon-carbon bonds on said substrate and assisting in causing fragmentation by severing carbon bonds of said fullerene molecules consisting of carbon-carbon bonds; and (f) forming a thickness of said hydrogen free diamond or diamond-like films on said substrate.

22. The method as defined in claim 21 wherein said vapor containing fullerene molecules consists essentially of fullerene molecules.

23. The method as defined in claim 21 wherein said vapor containing fullerene molecules consists essentially of a mixture of fullerene molecules and an inert gas.

24. The method as defined in claim 21 wherein fragmentation results in forming $C_2$ fragments.

* * * * *

UNITED STATES PATENT AND TRADEMARK OFFICE
CERTIFICATE OF CORRECTION

PATENT NO. : 5,370,855
DATED : Dec. 6, 1994
INVENTOR(S) : Gruen, Dieter M.

It is certified that error appears in the above-indentified patent and that said Letters Patent is hereby corrected as shown below:

Col. 1, Line 18, cancel "an" and insert --art--;

Col. 1, Line 21, cancel "500°C" and insert --1500°C--;

Col. 1, Line 24, cancel "convened" and insert --converted--;

Col. 1, Line 30, cancel "for" and insert --form--;

Col. 1, Line 31, cancel "for" and insert --form--;

Col. 1, Line 39, cancel "fullerene" and insert --Fullerene--;

Col. 2, Line 5, cancel "of" and insert --or--;

Col. 2, Line 37, cancel "RE" and insert --RF--;

Col. 6, Line 61, after "device" insert --a DC thermoplasma device,--

Signed and Sealed this

Twenty-ninth Day of April, 1997

Attest:

BRUCE LEHMAN

*Attesting Officer*

*Commissioner of Patents and Trademarks*

UNITED STATES PATENT AND TRADEMARK OFFICE
CERTIFICATE OF CORRECTION

PATENT NO. : 5,370,855
DATED : December 6, 1994
INVENTOR(S) : Dieter M. Gruen

It is certified that error appears in the above-indentified patent and that said Letters Patent is hereby corrected as shown below:

Column 1, line 7, insert the following information:

--This invention was made with Government support under Contract No. W-31-109-ENG-38 between the University of Chicago and the U.S. Department of Energy. The Government has certain rights in this invention.--.

Signed and Sealed this

Tenth Day of June, 1997

Attest:

BRUCE LEHMAN

*Attesting Officer*     *Commissioner of Patents and Trademarks*